(12) United States Patent
Broekaart et al.

(10) Patent No.: US 8,575,002 B2
(45) Date of Patent: Nov. 5, 2013

(54) DIRECT BONDING METHOD WITH REDUCTION IN OVERLAY MISALIGNMENT

(75) Inventors: Marcel Broekaart, Theys (FR); Gweltaz Gaudin, Grenoble (FR); Arnaud Castex, Grenoble (FR)

(73) Assignee: Soitec, Bernin (FR)

( * ) Notice: Subject to any disclaimer, the term of this patent is extended or adjusted under 35 U.S.C. 154(b) by 111 days.

(21) Appl. No.: 13/192,813

(22) Filed: Jul. 28, 2011

(65) Prior Publication Data

US 2012/0077329 A1 Mar. 29, 2012

(30) Foreign Application Priority Data

Sep. 23, 2010 (FR) ..................... 10 57647

(51) Int. Cl.
*H01L 21/30* (2006.01)
*H01L 21/46* (2006.01)

(52) U.S. Cl.
USPC .................... 438/455; 438/457; 257/E21.211

(58) Field of Classification Search
USPC ........................ 438/455, 457; 257/E21.211
See application file for complete search history.

(56) References Cited

U.S. PATENT DOCUMENTS

| 5,071,785 | A | | 12/1991 | Nakazato et al. ............... 437/62 |
| 5,273,553 | A | * | 12/1993 | Hoshi et al. ................ 29/25.01 |
| 2006/0024917 | A1 | | 2/2006 | Henley et al. ............... 438/455 |
| 2006/0141742 | A1 | | 6/2006 | Fournel et al. .............. 438/455 |
| 2006/0160329 | A1 | | 7/2006 | Henley et al. ............... 438/457 |
| 2008/0141510 | A1 | | 6/2008 | Henley et al. .............. 29/25.01 |
| 2012/0006463 | A1 | * | 1/2012 | Gaudin ........................... 156/64 |

FOREIGN PATENT DOCUMENTS

| EP | 0 410 679 A1 | 1/1991 |
| FR | 2 848 337 A1 | 6/2004 |
| JP | 2006278971 A | 10/2006 |
| WO | WO 2010/102943 A1 | 9/2010 |

OTHER PUBLICATIONS

French Search Report, FR 1057647 dated Feb. 23, 2011.
Kevin T. Turner et al., "Predicting Distortions and Overlay Errors Due To Wafer Deformation During Chucking on Lithography Scanners", J. Micro/Nanolith. MEMS MOEMS, vol. 8(4), pp. 043015-1-043015-8 (2009).
Kevin T. Turner et al., "Mechanics of Wafer Bonding: Effect of Clamping", Journal of Applied Physics vol. 95, No. 1, pp. 349-355 (2004).
Kevin T. Turner et al., "Modeling of Direct Wafer Bonding: Effect of Wafer Bow and Etch Patterns", Journal of Applied Physics vol. 92, No. 12, pp. 7658-7666 (2002).
Hyun-Joon Kim Lee et al, "Capillary Assisted Alignment for High Density Wafer-Level Integration", Conference of Wafer Bonding for MEMS and Wafer-Level Integration, University of Wisconsin-Madison, Slides 1-26, Dec. 10, 2007.

* cited by examiner

*Primary Examiner* — Stephen W Smoot
*Assistant Examiner* — Vicki B Booker
(74) *Attorney, Agent, or Firm* — Winston & Strawn LLP

(57) ABSTRACT

A method for the direct bonding of a first wafer having an intrinsic curvature before bonding to a second wafer having an intrinsic curvature before bonding, at least one of the two wafers including at least one series of microcomponents. The method includes bringing the two wafers into contact with each other so as to initiate the propagation of a bonding wave therebetween while imposing a predefined bonding curvature in the form of a paraboloid of revolution on one of the two wafers depending at least upon the intrinsic curvature before bonding of the wafer that includes the microcomponents, with the other wafer being free to conform to the predefined bonding curvature.

18 Claims, 10 Drawing Sheets

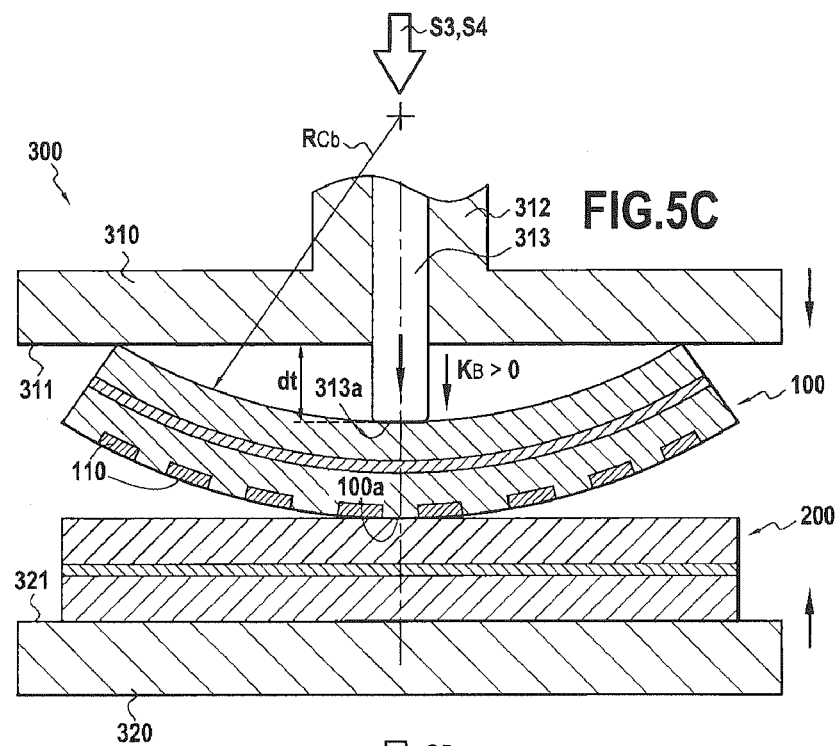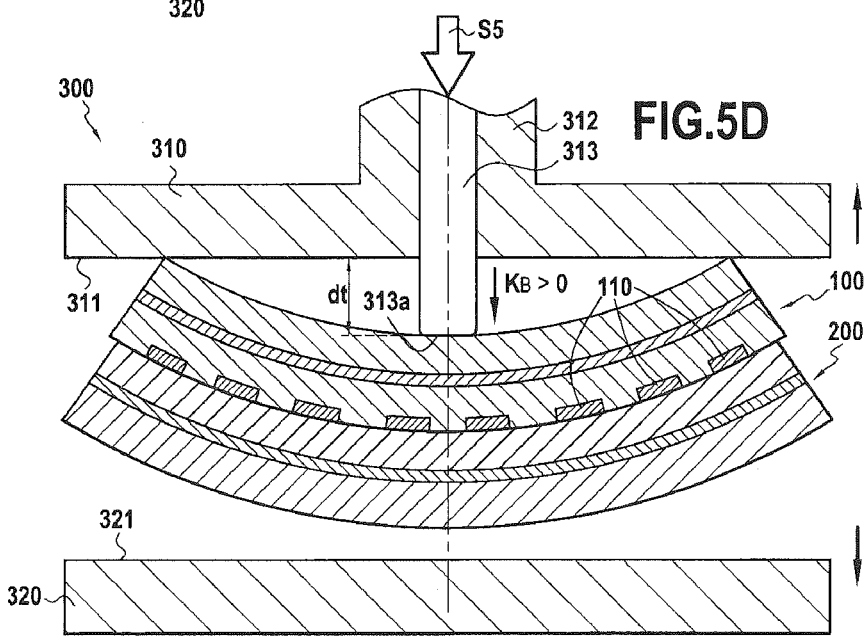

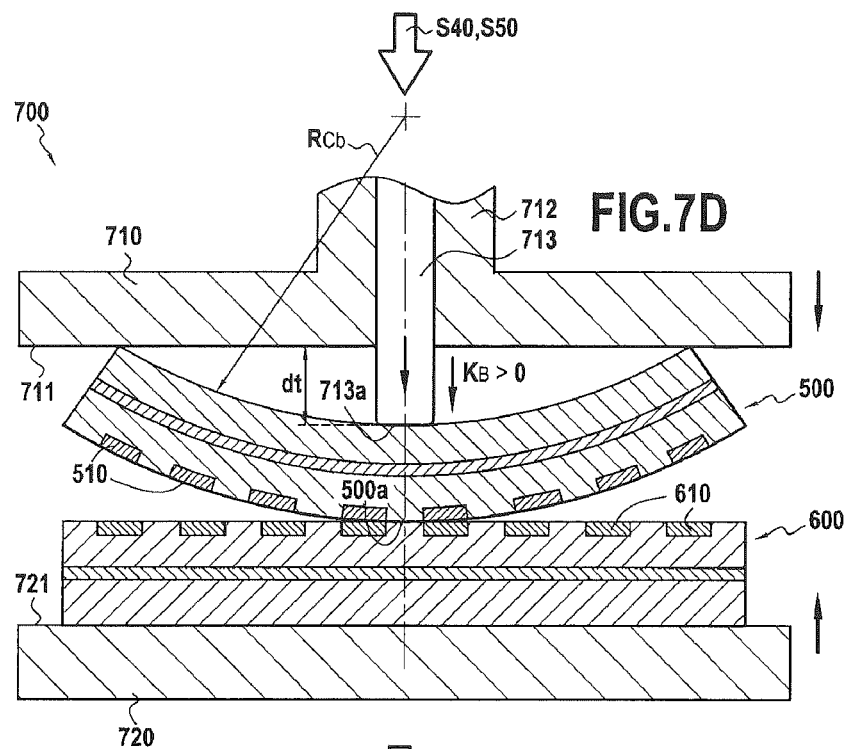
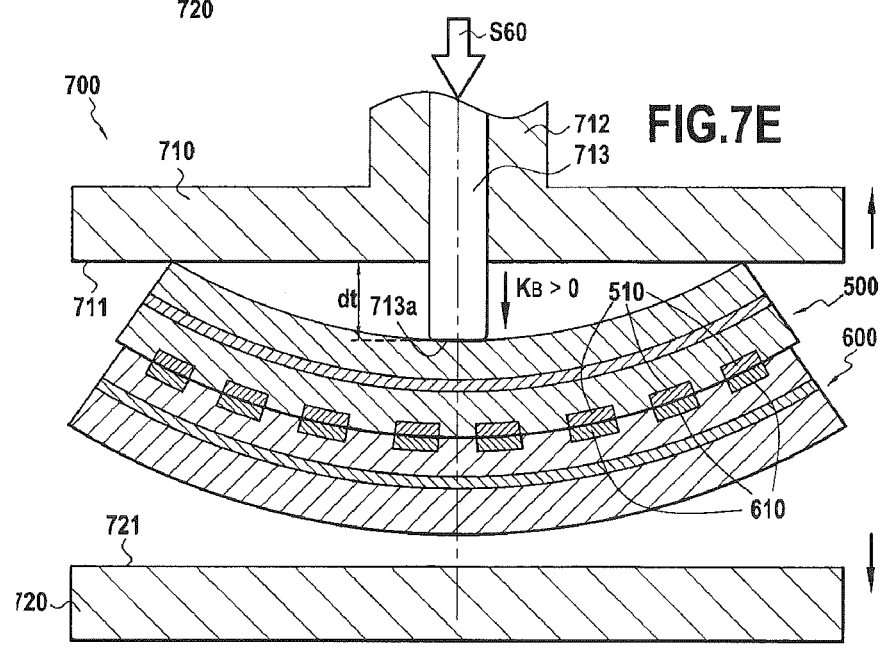

DIRECT BONDING METHOD WITH REDUCTION IN OVERLAY MISALIGNMENT

TECHNICAL FIELD AND BACKGROUND ART

The present invention relates to the field of multilayer semiconductor structures or wafers produced according to the three-dimensional (3D) integration technology for transferring, onto a first wafer, called the final substrate, at least one layer formed from a second wafer, this layer corresponding to that portion of the second wafer in which elements, for example a plurality of microcomponents, have been formed, it being possible for the first wafer to be a virgin wafer or to comprise other corresponding elements.

In particular, because of the very small size and the large number of microcomponents present on a given layer, each transferred layer, that is to say each wafer comprising the layer, must be positioned on the final substrate (the first wafer alone or already having other transferred layers) with a correct precision so as to meet an alignment tolerance of around 0.3 microns with the subjacent layer. Furthermore, it may be necessary to carry out treatments on the layer after it has been transferred, for example to form other microcomponents, to expose, on the surface, microcomponents, to produce interconnects, etc., these treatments also having to be carried out very precisely with respect to the elements present in the layer.

These elements, such as microcomponents, are typically formed by the well-known technique of photolithography which consists mainly in irradiating a substrate made photosensitive (for example by applying a photoresist on the substrate) in defined zones corresponding to the locations where the microcomponents have to be formed. The irradiation of the substrate is typically carried out using a selective irradiation apparatus, commonly referred to as a "stepper", which, unlike an apparatus for overall irradiation, irradiates during an operation only part of the substrate through a mask formed from opaque and transparent zones for defining the pattern that it is desired to reproduce on the substrate. The irradiation tool or stepper repeats the irradiation operation at as many places as necessary in order to irradiate the entire surface of the substrate.

The transfer of a layer onto the final substrate involves bonding, for example by direct bonding (also called molecular adhesion), between a first wafer and a second wafer of the type described above, the second wafer then being in general thinned. During bonding, the two wafers are mechanically aligned. At least three principle types of deformation resulting in alignment defects may be observed between the two wafers, namely deformations of the offset or shift type, deformations of the rotation type and deformations of the radial type (also known as run-out deformations, corresponding to a radial expansion that increases linearly with the radius of the substrate).

In general, the stepper is capable of compensating for these types of defect using a compensating algorithm. It has been found, however, that after transfer, cases exist in which it is very difficult, if not impossible, to form supplementary microcomponents aligned with respect to the microcomponents formed before the transfer, while respecting the microcomponent technology requirements, despite the use of such compensating algorithms.

In addition to alignment defects of the shift, rotation and radial type that are described above, inhomogeneous deformations may in fact occur in the transferred layer, because it is bonded by direct bonding, and also in the first wafer.

Now, it is these inhomogeneous deformations of the wafers that then result in this misalignment phenomenon, also called "overlay", which is described in relation to FIG. 1. The overlay takes the form of defects of around 50 nm in size, these being markedly smaller than the alignment precision of the wafers at the moment of bonding.

FIG. 1 illustrates a three-dimensional structure 400 obtained by low-pressure direct bonding between a first wafer or initial substrate 410, on which a first series of microcomponents 411 to 419 have been formed by photolithography by means of a mask for defining the pattern formation zones corresponding to the microcomponents to be produced, and a second wafer or final substrate 420. The initial substrate 410 has been thinned after bonding so as to remove a portion of material present above the layer of microcomponents 411 to 419 and a second layer of microcomponents 421 to 429 has been formed on the exposed surface of the initial substrate 410.

Despite using positioning tools, however, offsets occur between certain of the microcomponents 411 to 419 on the one hand, and microcomponents 421 to 429 on the other, such as the offsets $\Delta_{11}$, $\Delta_{22}$, $\Delta_{33}$, $\Delta_{44}$ indicated in FIG. 1 (corresponding to the observed offsets between the pairs of microcomponents 411/421, 412/422, 413/423 and 414/424 respectively).

These offsets do not result from individual transformations (translations, rotations or combinations thereof) that could stem from an imprecise assembly of the substrates. These offsets result from inhomogeneous deformations that appear in the layer, coming from the initial substrate while it is being bonded to the final substrate. In fact, these deformations cause non-uniform, local displacements at certain microcomponents 411 to 419. Thus, certain microcomponents 421 to 429 formed on the exposed surface of the substrate after transfer exhibit variations in position with these microcomponents 411 to 419 that may be of the order of a few hundred nanometers, or even a micron. This misalignment or overlay phenomenon may make it impossible to use the stepper if the amplitude of the overlay after correction is still for example between 50 nm and 100 nm, depending on the application. It is therefore very difficult, if not impossible, to form supplementary microcomponents in alignment with the microcomponents formed before the transfer.

This overlay effect between the two layers of microcomponents may furthermore be a source of short circuits, distortions in the stack, or connection defects between the microcomponents of the two layers. Thus, in the case in which the transferred microcomponents are images formed from pixels and the purpose of the post-transfer processing steps is to form colour filters on each of the pixels, a loss of colouring function for certain of these pixels is observed.

Therefore, if this misalignment or overlay effect is not controlled, it thus results in a reduction in the quality and the value of the multilayer semiconductor wafers that are fabricated. The impact of this effect becomes increasingly critical because of the ever increasing requirements with respect to miniaturization of the microcomponents and the integration density per layer thereof.

Accordingly, there is a need in the art for improvements in this area, and such improvements are now provided by the present invention.

SUMMARY OF THE INVENTION

The present invention advantageously provides a solution for reducing the appearance of the overlay effect after bonding two wafers by direct bonding. For this purpose, the present invention specifically provides a method for the direct bonding of a first wafer having an intrinsic curvature before bonding to a second wafer having an intrinsic curvature before bonding, at least one of the two wafers comprising at least one series of microcomponents, the method comprising at least one step of bringing the two wafers into contact with each other so as to initiate the propagation of a bonding wave between the two wafers, characterized in that during the contacting step, a predefined bonding curvature in the form of a paraboloid of revolution is imposed on one of the two wafers, the bonding curvature depending at least on the intrinsic curvature before bonding of the wafer comprising one series of microcomponents, the other wafer being free to conform to the predefined bonding curvature.

As will be explained below in detail, by controlling the curvature of the wafers while they are being bonded, depending on the intrinsic curvature of the layer comprising the microcomponents and in the form of a paraboloid of revolution, it is possible to control the deformations induced in this wafer during and after bonding so that they are essentially of the radial type, that is to say homogeneous deformations that can be corrected by the algorithms used by apparatus of the stepper type during the production of microcomponents.

According to one aspect of the invention, before the wafers are bonded together, the method comprises the following steps:

the curvature of each wafer before bonding is measured; and the predefined bonding curvature is calculated.

According to another aspect of the invention, when only the first wafer comprises at least one series of microcomponents, the predefined bonding curvature in the form of a paraboloid of revolution is calculated from the following formula:

$$KB=K1-((K2-K1)/6)$$

in which KB is the predefined bonding curvature in the form of a paraboloid of revolution, K1 is the intrinsic curvature of the first wafer before bonding and K2 is the intrinsic curvature of the second wafer before bonding.

According to yet another aspect of the invention, when each of the two wafers comprises at least one series of microcomponents, the predefined bonding curvature in the form of a paraboloid of revolution is calculated from the following formula:

$$KB=(K1+K2)/2$$

in which KB is the predefined bonding curvature in the form of a paraboloid of revolution, K1 is the intrinsic curvature of the first wafer before bonding and K2 is the intrinsic curvature of the second wafer before bonding.

The first and second wafers may especially be silicon wafers having a diameter of 300 mm.

According to one particular aspect of the invention, the method comprises the following steps:

the first wafer and the second wafer facing each other are held by a first holder and a second holder respectively, the first holder imposing on the first wafer the predefined bonding curvature in the form of a paraboloid of revolution;

the wafers are brought into contact with each other in order to initiate the propagation of a bonding wave between the wafers; and the second wafer is released from the second holder before or during the contacting with the first wafer so that the second wafer conforms to the predefined bonding curvature in the form of a paraboloid of revolution imposed on the first wafer during propagation of the bonding wave.

According to one particular embodiment of the invention, the predefined bonding curvature in the form of a paraboloid of revolution is imposed on the first wafer by actuating a cylinder mounted on the first holder.

According to another particular embodiment of the invention, the predefined bonding curvature in the form of a paraboloid of revolution is imposed on the first wafer by a membrane interposed between the first wafer and the first holder, with the membrane having a curvature in the form of a paraboloid of revolution corresponding to the predefined bonding curvature in the form of a paraboloid of revolution.

According to yet another particular embodiment of the invention, the predefined bonding curvature in the form of a paraboloid of revolution is imposed on the first wafer by the first holder, with the first holder having a curvature in the form of a paraboloid of revolution corresponding to the predefined bonding curvature in the form of a paraboloid of revolution.

According to a particular aspect of the invention, the wafers each comprise microcomponents on their respective bonding faces, at least some of the microcomponents of one of the wafers being intended to be aligned with at least some of the microcomponents of the other wafer. Preferably, the imposing of the predefined bonding curvature is conducted to reduce or minimize overlay microcomponent misalignment between the bonded wafers.

The imposing of the predefined bonding curvature may be achieved by applying a force on a central area of the wafer that includes microcomponents to obtain the desired radius of curvature. Alternatively, the imposing of the predefined bonding curvature may be achieved by applying a membrane adjacent to the wafer that includes microcomponents, with the membrane having a curvature corresponding to the predefined bonding curvature. For either option, the method further comprises releasing the other wafer after it conforms to the predefined bonding curvature and the wafers are bonded together.

Another embodiment of the present invention relates to a bonding apparatus for the direct bonding of a first wafer having an intrinsic curvature before bonding to a second wafer having an intrinsic curvature before bonding, at least one of the two wafers comprising at least one series of microcomponents, the apparatus comprising first and second holders for holding the first wafer and the second wafer respectively, characterized in that the first holder comprises means for imposing on the first wafer a predefined bonding curvature in the form of a paraboloid of revolution depending at least on the intrinsic curvature before bonding of the wafer comprising the layer of microcomponents, the apparatus controlling the second holder in order to release the second wafer from the second holder before or during the contacting with the first wafer so that the second wafer conforms to the predefined bonding curvature in the form of a paraboloid of revolution imposed on the first wafer during the propagation of a bonding wave.

According to one aspect of the invention, the apparatus comprises processing means for calculating the predefined bonding curvature in the form of a paraboloid of revolution depending on the intrinsic curvature before bonding of each of the two wafers or a radius of curvature corresponding to the predefined bonding curvature in the form of a paraboloid of revolution. However, these means may nevertheless be shifted relative to the bonding apparatus. In other words, the method may also operate if the treatment means are separate from the bonding apparatus.

According to one particular embodiment of the invention, the first holder further comprises a cylinder capable of imposing the predefined bonding curvature in the form of a paraboloid of revolution on the first wafer, the cylinder being controlled according to a radius of curvature corresponding to the predefined bonding curvature in the form of a paraboloid of revolution, and the apparatus controlling the second holder in order to release the second wafer from the second holder after contact with the first wafer so that the second wafer conforms to the predefined bonding curvature in the form of a paraboloid of revolution imposed on the first wafer during the propagation of a bonding wave.

According to another particular embodiment of the invention, the first holder has a curvature corresponding to the predefined bonding curvature in the form of a paraboloid of revolution or the apparatus further includes a membrane interposed between the first wafer and the first holder, the membrane having a curvature corresponding to the predefined bonding curvature in the form of a paraboloid of revolution.

According to another aspect of the invention, the first and second holders are designed to accommodate circular substrates measuring 100 mm, 150 mm, 200 mm or 300 mm in diameter. The invention is particularly suited for use with the larger diameter substrates.

BRIEF DESCRIPTION OF THE DRAWINGS FIGURES

FIGS. 5A to 5F are schematic views showing the production of a three-dimensional structure implementing the direct bonding method in accordance with one embodiment of the present invention;

FIGS. 7A to 7G are schematic views illustrating the production of a three-dimensional structure implementing the direct bonding method in accordance with another embodiment of the present invention.

DETAILED DESCRIPTION OF THE PREFERRED EMBODIMENTS OF THE INVENTION

The invention applies to the direct bonding between two wafers, at least one of these two wafers comprising microcomponents that have been produced before the bonding operation. For the sake of simplification, the term "microcomponents" will refer in the rest of this text to devices or any other features resulting from the technological steps carried out on or in the layers, the positioning of which must be precisely controlled. These may therefore be active or passive components, having simple patterns, contact pads or interconnects.

To reduce the appearance of the overlay effect described above, the present invention proposes to reduce the inhomogeneous deformations of the wafers resulting from being bonded, by imposing on the wafers, during bonding, a bonding curvature that has been defined beforehand depending on the initial curvature of the wafer or wafers comprising the microcomponents.

Figure 1:
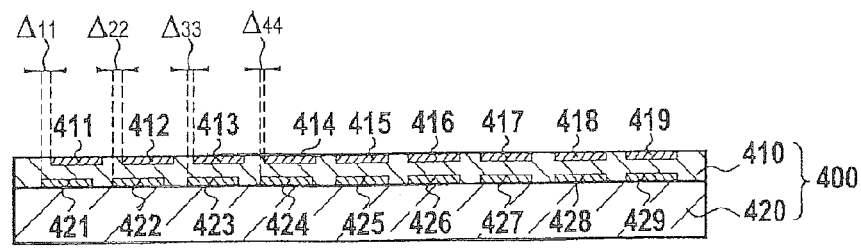
FIG. 1 is a schematic sectional view showing overlay-type alignment defects between microcomponents of two wafers after they have been bonded by direct bonding according to the prior art.
Figure 2:
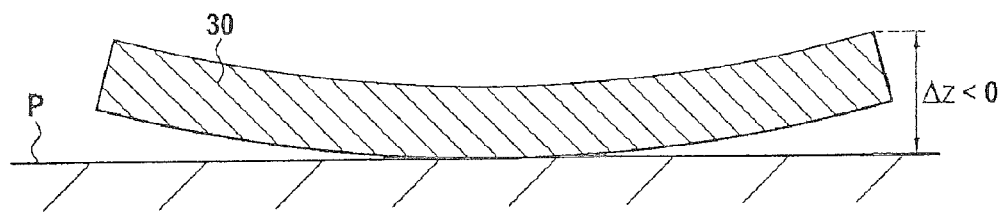
FIGS. 2 and 3 show wafers exhibiting bow-type deformations.
Figure 3:
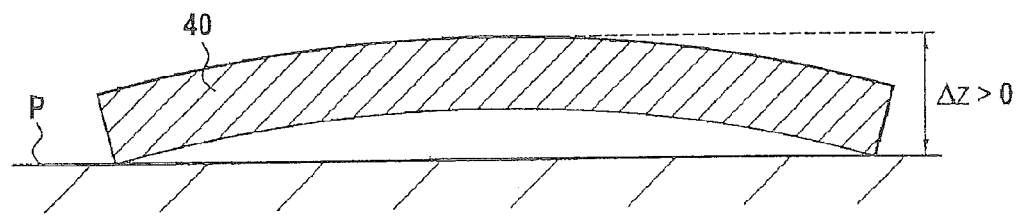

Before bonding, each wafer has an intrinsic curvature which may be concave, as in the case of the wafer 30 in FIG. 2, or convex as in the case of the wafer 40 in FIG. 3. This curvature determines the curvature deformation of the wafers, referred to as "bow" in the semiconductor technology. As illustrated in FIGS. 2 and 3, the bow $\Delta z$ of a wafer corresponds to the distance (deflection), generally measured at the center of the wafer, between a reference plane P (typically a perfectly flat plane) on which the wafer rests freely and the wafer itself. On the scale of the diameters of the wafers normally used in the semiconductor field, namely between a few tens of millimeters and 300 millimeters, the bow is measured in microns, whereas the curvature is generally measured in $m^{-1}$ or $km^{-1}$ since the curvature of the wafers used in the semiconductor field is very small and consequently the corresponding radius of curvature is very large.

Figure 4A:
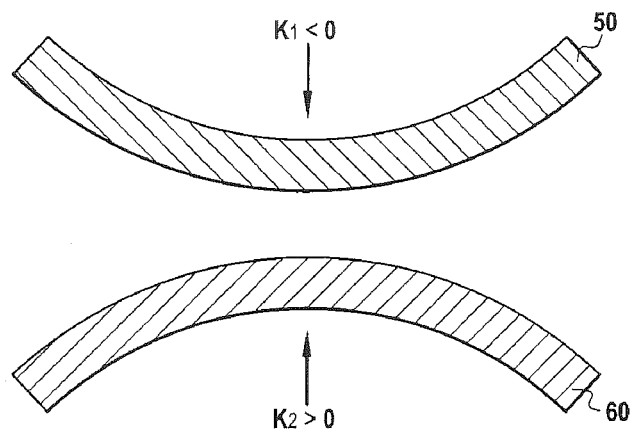
FIGS. 4A to 4C show the various curvatures obtained before, during and after the two wafers have been bonded by direct bonding.
Figure 4B:
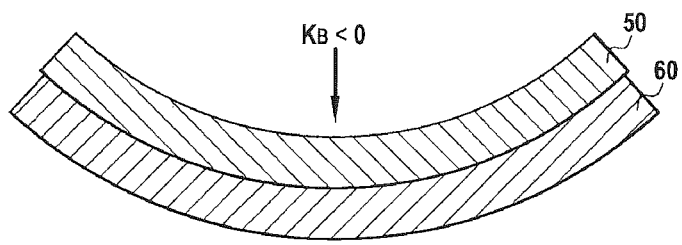
Figure 4C:
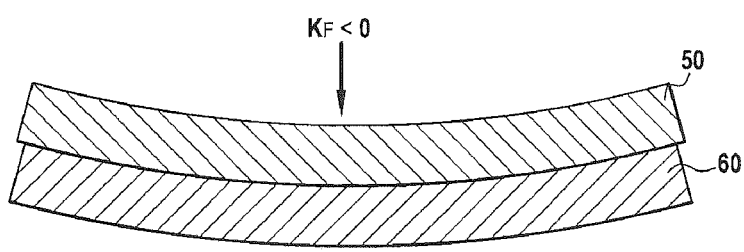

FIGS. 4A to 4C show the change in curvature before and after bonding of a first wafer 50 (the top) to a support wafer 60 (at the bottom), these wafers having initial curvatures K1 and K2 respectively, that is to say intrinsic curvatures before bonding (FIG. 4A). During direct bonding, a curvature KB, called the bonding curvature, is imposed on one of the two wafers 50 and 60 (FIG. 4B), the other wafer conforming to the curvature imposed on this first wafer during the propagation of the bonding wave, as will be explained in detail below. The curvature KB may be imposed by specific holders of a bonding machine as will be described in detail below, the curvature KB being imposed on only one of the two wafers, whereas the other wafer is free to deform at the moment when the propagation of the bonding wave is initiated, so as to conform, during this propagation, to the curvature imposed on the other wafer.

Once the bonding operation has been carried out and the wafers have been released from their respective holder, the structure formed by the assembly of the bonded wafers 50 and 60 has a curvature KF, called the post-bonding curvature.

The post-bonding curvature KF may be calculated from the following formula:

$$KF=(2(K1+K2)+12KB)/16 \qquad (1).$$

This formula was determined from formula (12) given in the document by T. Turner et al., entitled "Mechanics of wafer bonding: Effect of clamping", Journal of Applied Physics, Vol. 95, No. 1, Jan. 1, 2004.

As explained above, when two wafers, at least one of which includes microcomponents, are bonded by direct bonding, inhomogeneous deformations may occur in the wafer comprising the microcomponents, but it is not possible for these deformations to be compensated for by compensating algorithms of the stepper-type apparatus during formation of supplementary microcomponents after bonding, which then results in undesirable overlays between the microcomponents formed before and after bonding.

In contrast, if after bonding the wafer comprising the microcomponents has virtually only deformations of the radial type, that is to say homogeneous deformations, these can be corrected after bonding by the compensating algorithms.

Therefore, the present invention proposes to control the post-bonding curvature so that the wafer or wafers comprising microcomponents have, after bonding, only deformations of the radial type, which can be corrected.

In the case of bonding between a first wafer, in or on which microcomponents have been formed beforehand and having an intrinsic curvature K1, and a second wafer with no microcomponent and having an intrinsic curvature K2, the invention demonstrates that that, in order to obtain only radial deformations in the first wafer, the deformation of the first wafer must be minimal and the post-bonding curvature KF must be in the form of a paraboloid of revolution. For this purpose, the wafers have an initial curvature at least approximately in the form of a paraboloid of revolution (in particular of spherical shape, which is one particular case of a paraboloid of revolution), making it possible to obtain a post-bonding curvature of similar shape after a bonding curvature in the form of a paraboloid of revolution has been imposed.

As is well known per se, the equation in Cartesian coordinates of a paraboloid of revolution is expressed as follows:

$$x^2 + y^2 = 2pz \quad (2)$$

where x, y and z are the Cartesian coordinates of the paraboloid of revolution and p is a constant.

The cylindrical equation for a paraboloid of revolution may be written as follows:

$$\rho^2 = 2pz \quad (3)$$

where $\rho$ is the cylindrical coordinate of the paraboloid of revolution (such that $\rho = x^2 + y^2$).

The total curvature KP of a paraboloid of revolution may be calculated from the following formula:

$$KP = p^2/(\rho^2 + p^2) \quad (4)$$

The minimum deformation of the first wafer comprising the microcomponents is obtained by making KF=K1. If this condition is applied to equation (1), a minimum deformation of the first wafer is obtained by imposing a bonding curvature KB in the form of a paraboloid of revolution, such that:

$$KB = K1 - ((K2-K1)/6) \quad (5)$$

In the case of bonding between a first wafer and a second wafer each comprising microcomponents formed before bonding and having an intrinsic curvature K1, and K2 respectively, the deformations of the first and second wafers must be minimal and the post-bonding curvature KF must be in the form of a paraboloid of revolution.

The minimum deformation of the first and second wafers comprising the microcomponents is obtained by making $KF = (K1+K2)/2$. If this condition is applied to equation (1), a minimum deformation of the first wafer is obtained by imposing a bonding curvature KB in the form of a paraboloid of revolution such that:

$$KB = (K1+K2)/2 \quad (6)$$

Thus, it is possible to determine the curvature KB in the form of a paraboloid of revolution to be imposed on the wafers during bonding using formula (5) or formula (6) depending on the fact that one or the two wafers comprise microcomponents or both wafers comprise microcomponents, respectively, so as to obtain the post-bonding curvature KF that enables the deformations in the wafer or wafers comprising the microcomponents to be controlled so that these deformations are of the radial type, that is to say homogeneous deformations that can be compensated for by a correction algorithm. The curvatures K1 and K2 are measured beforehand, for example by means of optical measurement instruments such as the KLA-Tencor Flexus from the company KLA-Tencor Corp. (or by any measurement using a capacitive gauge or by optical or mechanical profilometry enabling the bow to be determined).

An example of the production of a three-dimensional structure by transferring a layer of microcomponents formed on a first wafer 100 onto a second wafer 200 employing a bonding method with reduction of the overlay misalignment in accordance with one embodiment of the invention will now be described in relation to FIGS. 5A to 5F and FIG. 6. The wafers may especially have diameters of 150 mm, 200 mm and 300 mm.

Figure 5A:
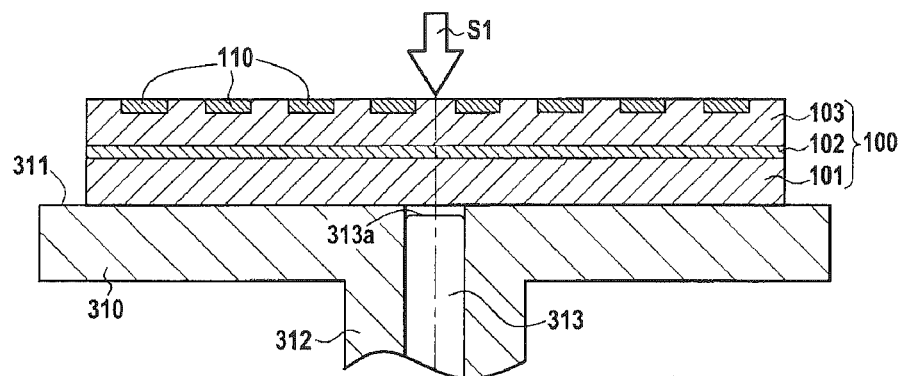

The production of the three-dimensional structure starts with the formation of a first series of microcomponents 110 on the surface of the first wafer 100 (FIG. 5A, step S1). The microcomponents 110 may be entire components and/or only partial components. In the example described here, the first wafer 100 is typically a 300 mm diameter wafer of the SOI (Silicon on Insulator) type comprising a silicon layer 103 on a substrate 101 also made of silicon, a buried oxide layer 102, for example made of $SiO_2$, being placed between the layer and the silicon substrate. The wafer 100 may also consist of a multilayer structure of another type or of a monolayer structure.

Figure 5B:
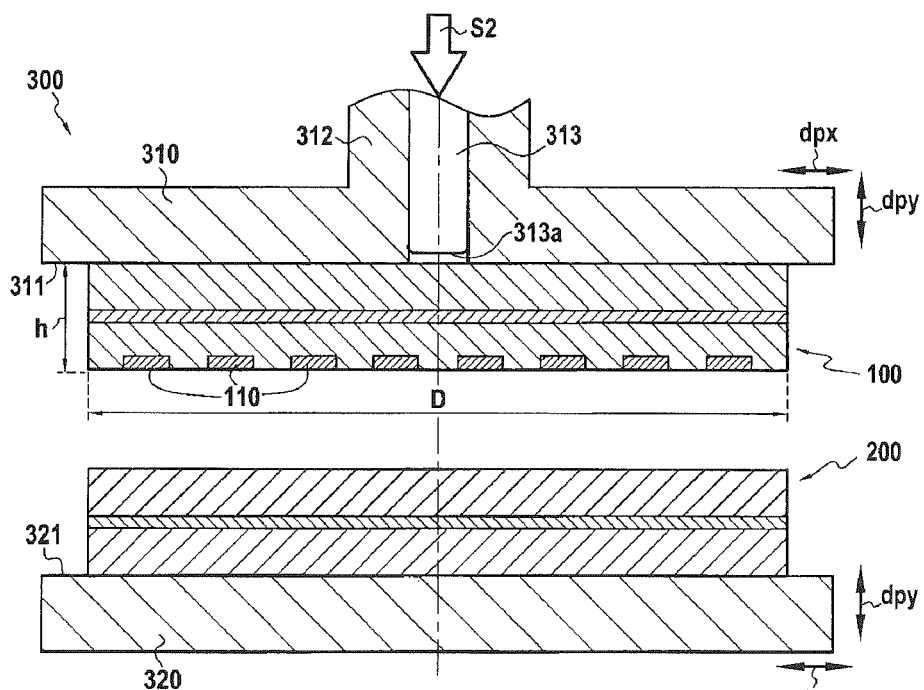

The second wafer 200 is typically a 300 mm diameter silicon wafer (FIG. 5B).

The microcomponents 110 are formed by photolithography using a mask for defining the zones for forming patterns corresponding to the microcomponents to be produced, with a selective irradiation tool of the stepper type being used to irradiate the zones where the patterns are to be produced.

The microcomponents 110 are intended to cooperate with microcomponents that will be formed on the transferred layer after the bonding operation. It is therefore important to be able to ensure good alignment of the microcomponents 110 and 210 after the wafers have been bonded.

In accordance with the invention, a bonding machine is used which, during bonding, imposes a bonding curvature KB in the form of a paraboloid of revolution on one of the wafers, while enabling the other wafer to conform to the curvature imposed by propagation of the bonding wave between the two wafers. This operation makes it possible to obtain a target paraboloidal post-bonding curvature KFc that enables the deformation of the first wafer 100 to be controlled so that it is only radial, that is to say homogeneous, deformations resulting in misalignments that can be corrected using an appropriate algorithm. In the example described here, the wafers 100 and 200 have curvatures K1 and K2 of paraboloidal form respectively. Therefore, a predefined bonding curvature KB of paraboloidal form is imposed here on the wafers.

As illustrated in FIG. 5B, the bonding operation is carried out using a bonding machine or apparatus 300 that comprises a first support plate 310 having a holding face 311 intended to keep the first wafer 100 facing the second wafer 200, which is held in place on the holding face 321 of a second support plate 320 of the machine 300. The support plates 310 and 320 are both equipped with holding means (not shown in FIG. 5B), such as electrostatic or suction holding means. The first and second support plates 310 and 320 are each capable of moving in movement directions dpx and dpy which make it possible, on the one hand, to position the wafers facing each other, while compensating for the rotational and translational misalignment errors, and, on the other hand, to move the holding faces 311 and 321 of the first and second support plates 310 and 320 respectively closer together or further apart. In this way, each support plate is, for example, mounted on an actuator (not shown in FIG. 5B) which is controlled by the bonding machine so as to adjust the distance between the two holders along the direction dP.

At the start of bonding, the two wafers 100 and 200 are each held pressed against the holding faces of their respective support plates (FIG. 5B, step S2).

Next, in accordance with the invention, a curvature corresponding to the paraboloidal bonding curvature KB is imposed on the first wafer 100 (or alternatively on the second wafer), which curvature has been calculated by means of formula (5) given above and makes it possible to obtain the target paraboloidal post-bonding curvature KF determined beforehand so as to induce essentially deformations of the radial in the first wafer (FIG. 5C, step S3).

For this purpose, the first support plate 310 comprises a linear actuator or cylinder 321 provided with a rod 313 which, when the cylinder is actuated, extends beyond the holding face 311 of the plate 310 against which the first wafer 100 is pressed. As illustrated in FIG. 5C, in this case the free end 313a of the rod 313 presses on the first wafer, thereby enabling a defined paraboloidal bonding curvature to be imposed on the wafer. During actuation of the cylinder 312, the attractive force of the means for holding the support plate 310, namely the suction force or the electrostatic force, may be controlled by the bonding machine so as to be reduced, or even eliminated, in a defined concentric central zone on the holding face 311 of the plate 310 so as to reduce the stresses on the wafer as it is being curved by the rod 313.

The bonding machine 300 controls the distance dt by which the rod 313 projects from the holding face 311, this distance dt being determined depending on the bonding curvature KB to be imposed on the wafers. More precisely, the cylinder 312 is equipped with a servocontrol (not shown) which controls the linear position of the rod 313 according to a set point position defined by the bonding machine 300.

The bonding machine 300 is equipped with processing means, such as a programmable microprocessor, with the means capable of calculating the paraboloidal bonding curvature KB or a radius of curvature equivalent to the paraboloidal bonding curvature KB in the case of the use of a cylinder as in the machine 300 described here. More precisely, the initial curvatures K1 and K2 of the wafers 100 and 200 respectively, and also the paraboloidal target post-bonding curvature KF, are input into the bonding machine, the processing means of the bonding machine then calculating the paraboloidal bonding curvature KB to be imposed, using formula (5) given above and inverts this value in order to obtain the corresponding target radius of curvature Rcb (Rcb=1/KB).

The final parameter to be defined, which must be sent to the servocontrol of the cylinder 312, is the bow $\Delta z$ corresponding to the radius of curvature Rcb since, as indicated above, the bow of a wafer corresponds to the distance, measured at the center of the wafer, between a reference plane, here the holding face 311 of the surface of the wafer, here the surface of the wafer facing the holding face 311. The bow $\Delta z$ corresponds to the distance dt by which the rod 313 must be extended in order to impose the bonding curvature.

The target bow $\Delta zc$ may be calculated according to the target radius of curvature Rcb from the following formula:

$$\Delta zc = Rcb\sqrt{Rcb^2 - (D/2)^2} \quad (7)$$

where D is the diameter of the wafer to be curved.

Once it has been calculated, the numerical value of the target bow $\Delta zc$ is transferred to the servo control of the cylinder 312 which actuates the rod so as to position it at the equivalent distance dt (dt=$\Delta zc$).

To impose a paraboloidal bonding curvature on the wafers during bonding, the rod 313 of the cylinder 312 is placed at the center of the wafer 100.

When the paraboloidal bonding curvature KB is imposed on the first wafer 100, the support plates 310 and 320 are moved closer together so that the most advanced portion 100a (crown) of the wafer 100 is delicately placed in contact with the exposed surface of the second wafer 200 and thus the propagation of a bonding wave is initiated (FIG. 5C, step S4). The means for holding the second wafer 200 on its support plate 320 have been deactivated before or during the contacting of the two wafers so as to allow the second wafer 200 to conform to the deformation (curvature KB) imposed on the first wafer 100 during bonding.

Alternatively, it is possible to place the two wafers at a distance $\Delta zc$ apart and then to deform one of the two wafers so as to bring the surfaces into intimate contact with each other by moving the rod 313 over a distance dt=$\Delta zc$. In this way, the paraboloidal bonding curvature KB and the initiation of the propagation of the bonding wave are simultaneously imposed. In this case too, that wafer which is not deformed to the predefined bonding curvature must be free to conform to the paraboloidal bonding curvature imposed on the other wafer during the propagation of the bonding wave.

Direct bonding is a technique well known per se. As a reminder, the principle of direct bonding is based on bringing two surfaces into direct contact with each other, that is to say without the use of a specific material (adhesive, wax, braze, etc.). Such an operation requires that the surfaces to be bonded together are to be sufficiently smooth, free of any particles or contamination, and are to be sufficiently close together to initiate a contact typically at a distance of less than a few nanometers. In this case, the attractive forces between the two surfaces are quite high, so as to propagate a bonding wave that results in direct bonding (bonding caused by the combination of attractive forces (Van der Waals forces) involving the electronic interaction between atoms or molecules of the two surfaces to be bonded together). Direct bonding is also referred to as molecular bonding.

Once the propagation of the bonding wave has been initiated, the second wafer 200, then released from its support plate 320, conforms to the curvature imposed on the first wafer 100 as the bonding wave progresses (FIG. 5D, step S5).

Figure 5E:
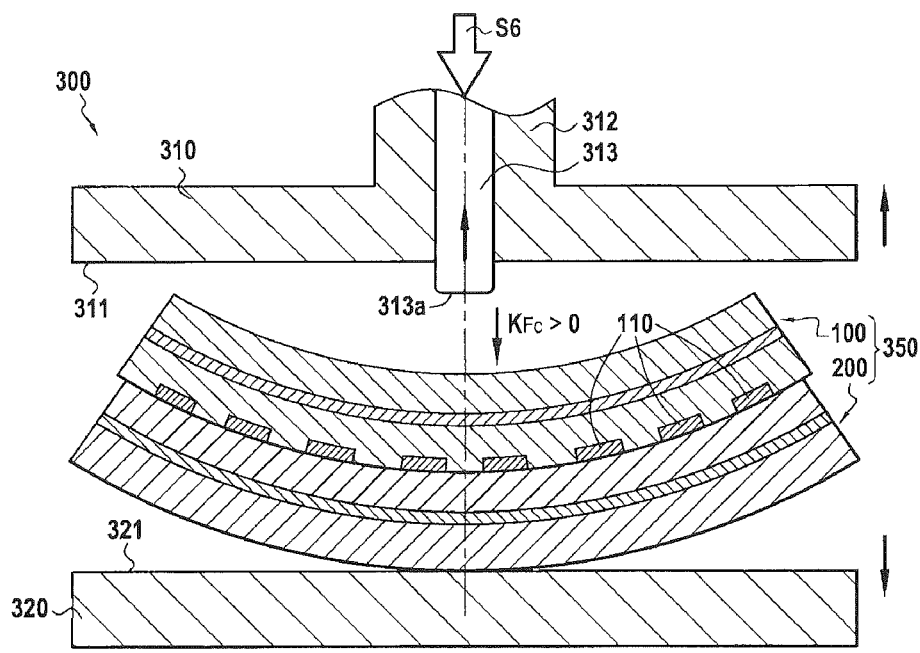

When the two wafers are completed bonded together, the first wafer 100 is fully released from its support plate (FIG. 5E, step S6). A three-dimensional structure 350 having the target paraboloidal curvature KF defined above is then obtained. The inhomogeneous deformations usually appearing during uncontrolled bonding are thus very significantly reduced.

After bonding, the structure 350 may be subjected to a moderate heat treatment (below 500° C.) so as to increase the bond strength between the two wafers and subsequently to thin one of them, without in any way damaging the microcomponents 110.

Figure 5F:
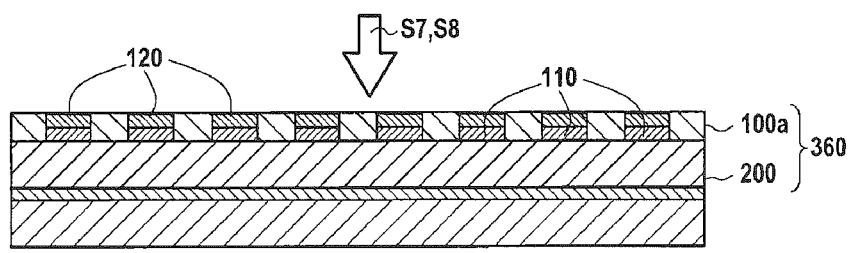
Figure 6:
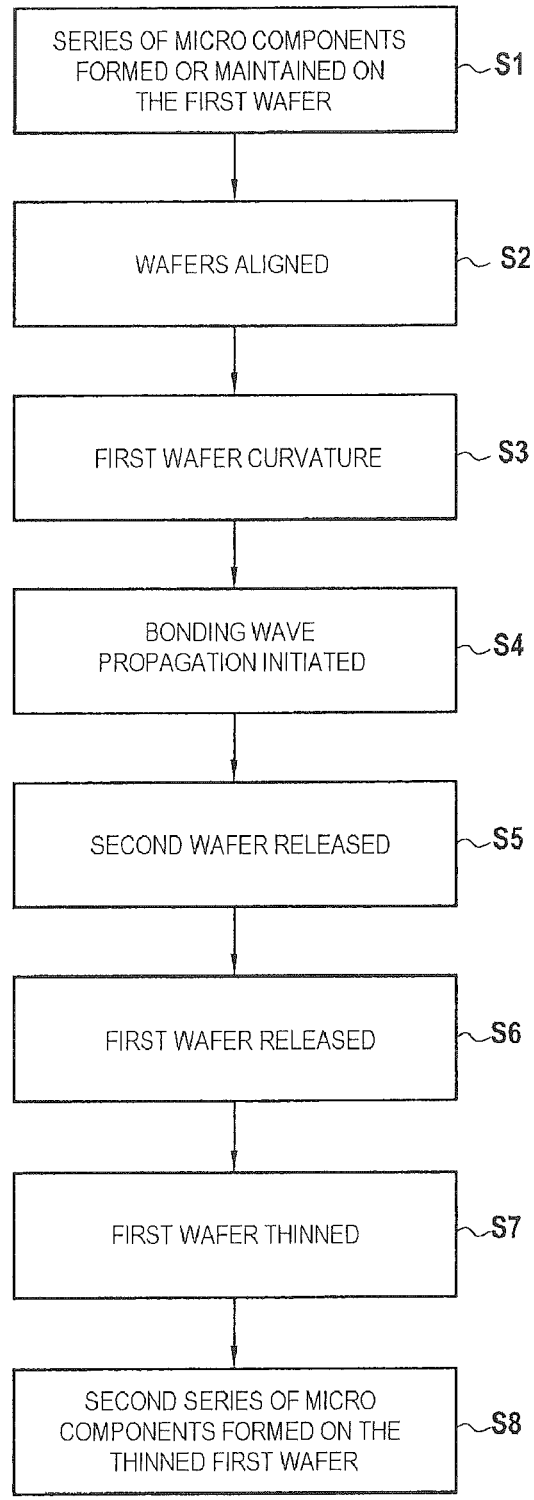
FIG. 6 is a flow chart illustrating the steps employed in producing the three-dimensional structure illustrated in FIGS. 5A to 5G.

As shown in FIG. 5F, the first wafer 100 is thinned so as to remove a portion of material present above the layer of microcomponents 110 (step S7). The wafer 100 may be thinned in particular by chemical-mechanical polishing (CMP), by chemical etching or by cleavage or fracture along a plane of weakness formed beforehand in the substrate, for example by atom or ion implantation. If the first wafer is an SOI-type substrate, as is the case here, it may be advantageous to use the buried insulating layer as chemical etching stop layer in order to delimit the thickness of the remaining layer 100a. Alternatively, if the initial substrate is made of a bulk material, deep contact pads, for example contact pads made of a metallic material and uniformly spaced apart on the surface of the substrate, may be formed beforehand in the latter during formation of the components so as to stop the mechanical thinning (polishing) operation.

A three-dimensional structure 360 formed from the second wafer 200 and a layer 100a corresponding to the remaining portion of the first wafer 100 is then obtained.

The inhomogeneous deformations usually appearing during uncontrolled bonding are thus very significantly reduced. After bonding, a second series of microcomponents 120 may be formed in correct alignment with the microcomponents 110, any misalignment between the microcomponents of the first and second series being corrected by means of an alignment correction algorithm (FIG. 5F, step S8).

Figure 7A:
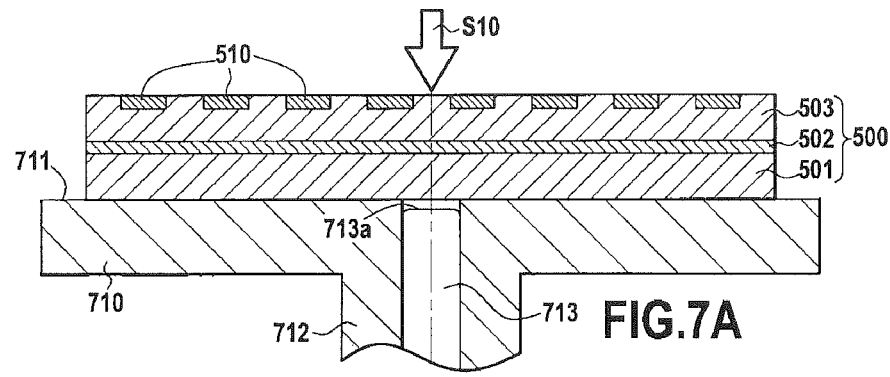
Figure 7B:
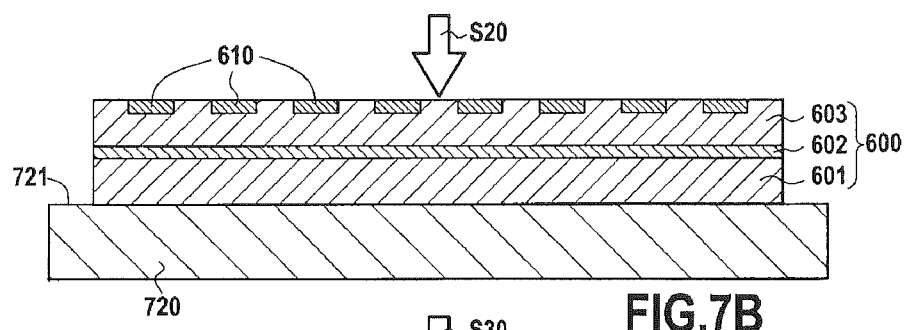

Another exemplary embodiment of a three-dimensional structure obtained by transferring a layer of microcomponents 510, formed on a first wafer 500, onto a second wafer 600, which also includes a layer of microcomponents 610, employing a bonding method with reduction in overlay misalignment in accordance with one embodiment of the invention will now be described in relation to FIGS. 7A to 7G and 8. In this embodiment, the wafers 500 and 600 have an initial curvature in the form of a paraboloid of revolution. The wafers may in particular have diameters of 150 mm, 200 mm or 300 mm Production of the three-dimensional structure starts with the formation of a first series of microcomponents 510 on the surface of the first wafer 500 (FIG. 7A, step S10) and a second series of microcomponents 610 on the surface of the second wafer 600 (FIG. 7B, step S20). The microcomponents 510 and 610 may be entire components and/or only partial components. In the embodiment described here, the first wafer 500 is a 300 mm diameter wafer of the SOI (Silicon on Insulator) type comprising a silicon layer 503 on a substrate 501, also made of silicon, a buried oxide layer 502, for example made of $SiO_2$, being placed between the layer and the silicon substrate. The wafer 500 may also consist of a multilayer structure of another type or a monolayer structure.

The second wafer 600 is a silicon wafer 300 mm in diameter.

The microcomponents 510 and 610 are formed by photolithography by means of a mask for defining the zones in which features corresponding to the microcomponents to be produced are formed.

The microcomponents 510 and 610 are intended to cooperate with one another, for example to form finished components by the pairwise combination of microcomponents 510 and 610, each constituting one portion of the component to be produced or to form circuits by the interconnection of corresponding microcomponents 510 and 610. It is therefore important to be able to ensure good alignment between the microcomponents 510 and 610 while the wafers are being bonded together.

In accordance with the invention, a bonding machine is used which, during bonding, imposes a bonding curvature KB in the form of a paraboloid of revolution to one of the wafers while allowing the other wafer to conform to the curvature imposed by propagation of the bonding wave between the two wafers. This operation makes it possible to obtain a target post-bonding curvature KF in the form of a paraboloid of revolution that enables the deformation of the two wafers 500 and 600 to be controlled so that they have only radial i.e., homogeneous, deformations resulting in very slight misalignment between the components 510 and 610 and possibly in subsequent overlays in the case in which components are subsequently formed in the remaining layer 500a after thinning, which subsequent overlays can be corrected by an appropriate algorithm.

Figure 7C:
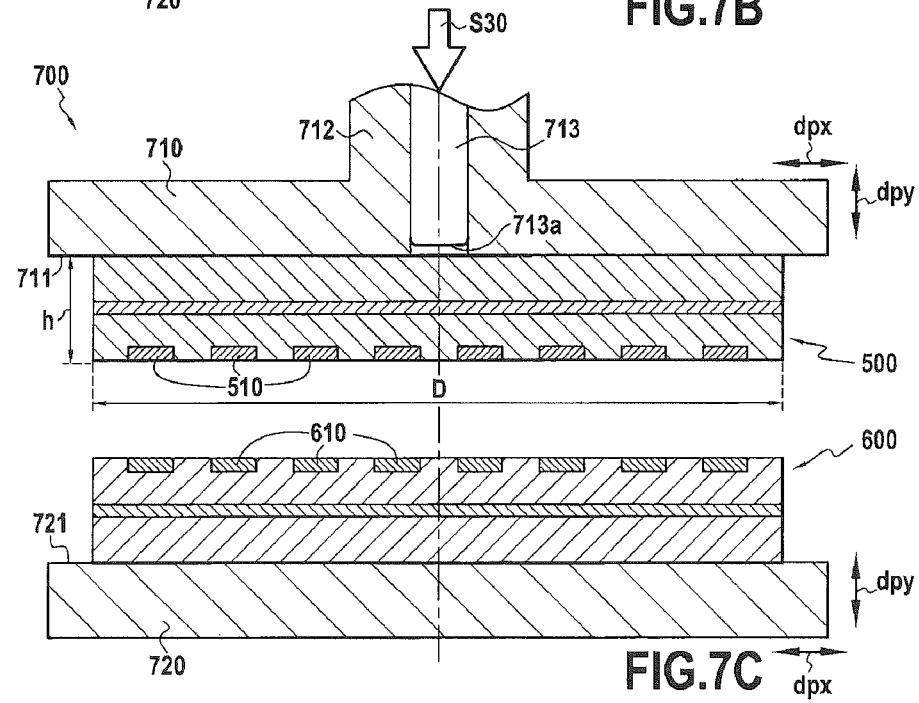

As illustrated in FIG. 7C, the bonding operation is carried out with a bonding machine or apparatus 700 that comprises, like the machine 300 described above, a first support plate 710 having a holding face 711 designed to hold the first wafer 500 so as to face the second wafer 600 which is held on the holding face 721 of a second support plate 720 of the machine 700.

At the start of bonding, the two wafers 500 and 600 are each held pressed against the holding faces of their respective support plates (FIG. 7C, step S30).

Next, in accordance with the invention, a curvature corresponding to the bonding curvature KB in the form of a paraboloid of revolution is imposed on the first wafer 500 (or alternatively on the second wafer), which bonding curvature has been calculated by means of formula (6) given above and makes it possible to obtain the target post-bonding curvature KF in the form of a paraboloid of revolution determined beforehand so as to induce essentially radial deformations in the two wafers (FIG. 7D, step S40).

As described above in respect of the machine 300, the first support plate 710 comprises a linear actuator or cylinder 712 provided with a rod 713 which, when the cylinder is actuated, extends beyond the holding face 711 of the plate 710, against which face the first wafer 100 is pressed. As illustrated in FIG. 7D, in this case the free end 713a of the rod 713 pushes on the center of the first wafer, thereby imposing a defined bonding curvature in the form of a paraboloid of revolution on the wafer.

The bonding machine 700 controls the distance dt by which the rod 713 projects from the holding face 711. As explained above, this distance dt is determined by the processing means of the machine 700 which, after having calculated the bonding curvature KB in the form of a paraboloid of revolution to be imposed, using formula (6) given above, and this value inverted so as to obtain the corresponding target radius of curvature Rcb (Rcb =1/KB), determines the corresponding target bow Δzc corresponding to the distance dt by which the rod 713 must extend during imposition of the bonding curvature ($\Delta zc = Rcb - \sqrt{(Rcb^2 - (D/2)^2)}$).

Once it has been calculated, the numerical value of the target bow Δzc is transmitted to the servocontrol of the cylinder 712 which actuates the rod in order to position it at the equivalent distance dt (dt=Δzc).

When the bonding curvature KB in the form of a paraboloid of revolution is imposed on the first wafer 100, the support plates 710 and 720 are moved closer together so that the most advanced portion 500a (crown) of the wafer 500 is delicately placed in contact with the exposed surface of the second wafer 600 and thus the propagation of a bonding wave is initiated (FIG. 7D, step S50). The means for holding the second wafer 600 on its support plate 720 have been deactivated before or during the contacting of the two wafers so as to allow the second wafer 600 to conform to the deformation (curvature KB) imposed on the first wafer 500 during bonding.

Alternatively, it is possible to place the two wafers at a distance Δzc apart and then to deform one of the two wafers so as to bring the surfaces into intimate contact by moving the rod 713 over a distance dt=Δzc. In this way, the bonding curvature KB in the form of a paraboloid of revolution and the initiation of the propagation of the bonding wave are simultaneously imposed. In this case too, that wafer which is not deformed to the predefined bonding curvature must be free to conform to the bonding curvature in the form of a paraboloid of revolution imposed on the other wafer during the propagation of the bonding wave.

Once the propagation of the bonding wave has been initiated, the second wafer 600, then released from its support plate 720, conforms to the curvature imposed on the first wafer 500 as the bonding wave progresses (FIG. 7E, step S60).

Figure 7F:
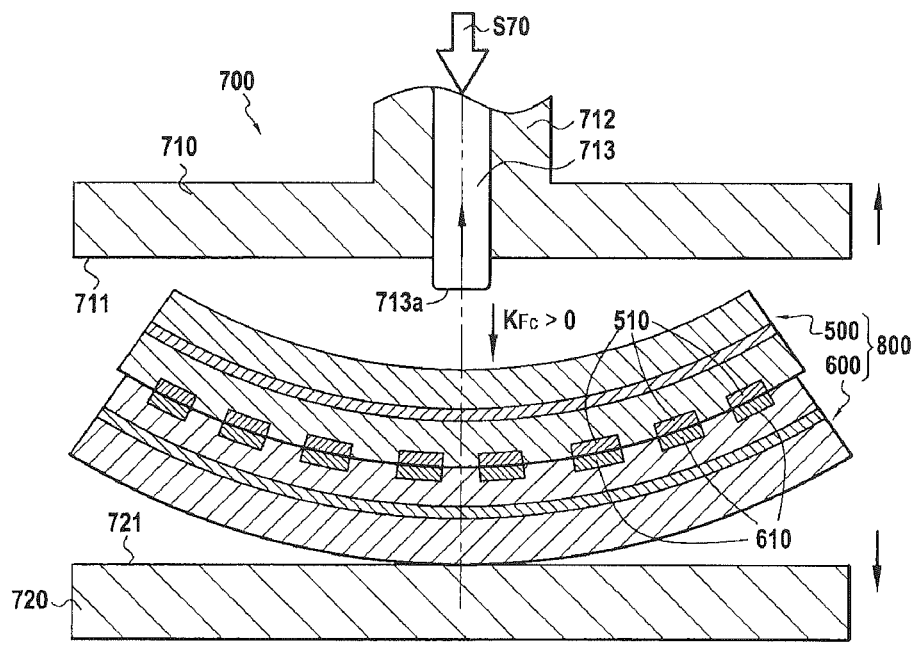

When the two wafers are completely bonded together, the first wafer 500 is fully released from its support plate (FIG. 7F, step S70). A three-dimensional structure 800 having the target curvature KF in the form of a paraboloid of revolution defined above is then obtained. The inhomogeneous deformations usually appearing during uncontrolled bonding are thus very significantly reduced.

After bonding, the structure 800 may be subjected to a moderate heat treatment (below 500° C.) so as to increase the bond strength between the two wafers, allow subsequent thinning of one of them and not to damage the microcomponents 510 and 610.

Figure 7G:
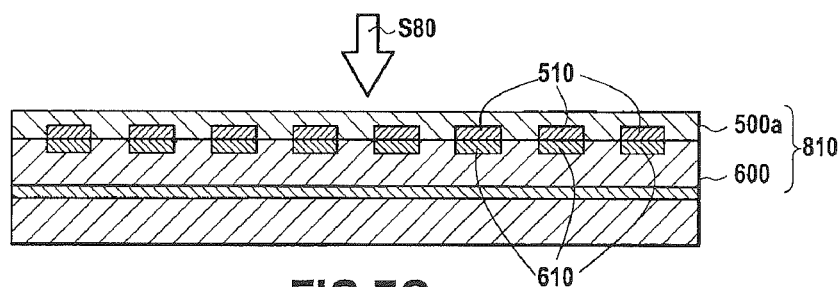
Figure 8:
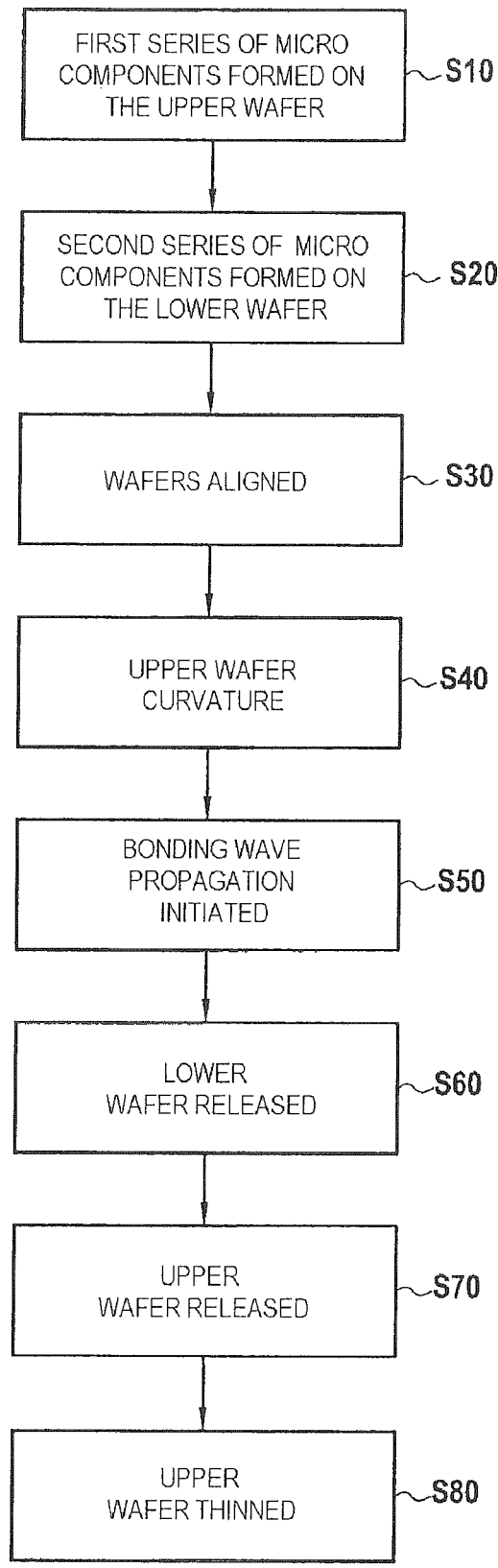
FIG. 8 is a flow chart illustrating the steps employed in producing the three-dimensional structure illustrated in FIGS. 7A to 7G.

As shown in FIG. 7G, the first wafer 500 is thinned so as to remove a portion of material present above the layer of microcomponents 510 (step S80). A three-dimensional structure 810 formed from the second wafer 200 and a layer 500a corresponding to the remaining portion of the first wafer 500 is then obtained.

According to an alterative embodiment, after the microcomponents have been formed, it is possible to deposit an oxide layer, for example made of $SiO_2$, on the surface of the first wafer and/or the second wafer, for the purpose of bonding preparation. This or these oxide layers may furthermore be prepared by forming metal contact pads therein, for example made of copper, in contact with all or some of the microcomponents so as to be able to bring the microcomponents of one wafer into contact with those of the other wafer.

The bonding surfaces of the wafers may also be treated. The treatments carried out for the surface preparation vary depending on the bond strength that it is desired to be obtained. If it is desired to obtain a standard, that is to say a relatively low, bond strength, the surface may be prepared by carrying out a chemical-mechanical polishing step followed by a cleaning step. Alternatively, if it is desired to obtain a high bond strength between the two substrates, the surface preparation comprises an RCA cleaning step (namely the combination of an SC1 ($NH_4OH$, $H_2O_2$, $H_2O$) bath suitable for removing particles and hydrocarbons and of an SC2 (HCl, $H_2O_2$, $H_2O$) bath suitable for removing metal contaminants), a plasma surface activation step, an additional cleaning step followed by a brushing step.

The bonding is preferably carried out at a controlled temperature so as to reduce the temperature difference between the two wafers.

The bonding curvature in the form of a paraboloid of revolution is calculated by the processing means of the bonding machine or by equivalent means away from the bonding machine using the formulae or equations (2) to (7) described above.

The bonding curvature may also be imposed using a bonding machine that includes a membrane interposed between the first wafer and the holder for the wafer, the membrane having a curvature corresponding to the predefined bonding curvature in the form of a paraboloid of revolution, or using a bonding machine comprising a holder for the first wafer that has a curvature corresponding to the predefined bonding curvature in the form of a paraboloid of revolution, it being especially possible for the holder to be deformable and controlled by the machine in order to conform to the bonding curvature calculated beforehand by the machine or by associated calculation means. The contacting of the second wafer with the first wafer and the freeing of the second wafer before the propagation of a bonding wave is initiated both take place as described above.

By virtue of the bonding method, the two wafers may be bonded together with homogeneous deformations causing only alignment defects that can be corrected by algorithms during the formation of supplementary microcomponents after bonding, resulting in a reduction in overlay misalignment. Thus, it is possible to limit the misalignment between microcomponents to negligible values that are homogeneous over the entire surface of the wafers. The microcomponents, even of very small size (for example <1 μm), may then be easily formed so as to be in mutual alignment. This makes it possible, for example, for the microcomponents to be mutually interconnected by means of metal connections, while minimizing the risk of a poor interconnection.

What is claimed is:

1. A method for reducing overlay misalignment during the direct bonding of a first wafer having a first intrinsic curvature to a second wafer having a second intrinsic curvature, with at least the first wafer comprising at least one series of microcomponents thereon, which method comprises:

contacting the wafers with each other so as to initiate the propagation of a bonding wave between the wafers, and imposing a predefined bonding curvature in the form of a paraboloid of revolution on one of the first or second wafers during the contacting, with the predefined bonding curvature depending at least upon the first intrinsic curvature of the first wafer comprising the at least one series of microcomponents thereon, with the other of the first or second wafers being free to conform to the predefined bonding curvature.

2. The method according to claim 1, wherein only the first wafer comprises microcomponents and which further comprises calculating the predefined bonding curvature in the form of a paraboloid of revolution is the following formula:

$$KB = K1 - ((K2 - K1)/6)$$

in which KB is the predefined bonding curvature in the form of a paraboloid of revolution, K1 is the intrinsic curvature of the first wafer before bonding and K2 is the intrinsic curvature of the second wafer before bonding.

3. The method according to claim 1, wherein each of the wafers comprises at least one series of microcomponents and which further comprises calculating the predefined bonding curvature in the form of a paraboloid of revolution is calculated from the following formula:

$$KB = (K1 + K2)/2$$

in which KB is the predefined bonding curvature in the form of a paraboloid of revolution, K1 is the intrinsic curvature of the first wafer before bonding and K2 is the intrinsic curvature of the second wafer before bonding.

4. The method according to claim 1, wherein the wafers are circular silicon wafers having a diameter of 300 mm.

5. The method according to claim 1, which further comprises:

holding the first wafer and the second wafer facing each other by first and second holders, respectively, with the first holder imposing on the first wafer the predefined bonding curvature in the form of a paraboloid of revolution prior to bringing the wafers into contact with each other in order to initiate the propagation of a bonding wave; and releasing the second wafer from the second holder before or during the contacting with the first wafer so that the second wafer conforms to the predefined bonding curvature in the form of a paraboloid of revolution imposed on the first wafer during propagation of the bonding wave.

6. The method according to claim 5, wherein the predefined bonding curvature in the form of a paraboloid of revolution is imposed on the first wafer by actuating a cylinder mounted on the first holder.

7. The method according to claim 6, wherein the predefined bonding curvature in the form of a paraboloid of revolution is imposed on the first wafer by a membrane interposed between the first wafer and the first holder, with the membrane configured and dimensioned to have a curvature in the form of a paraboloid of revolution corresponding to the predefined bonding curvature in the form of a paraboloid of revolution.

8. The method according to claim 6, wherein the predefined bonding curvature is imposed on the first wafer by the first holder, with the first holder having a curvature corresponding to the predefined bonding curvature in the form of a paraboloid of revolution.

9. The method according to claim 1, wherein the wafers each comprise microcomponents on their respective bonding faces, with at least some of the microcomponents of one of the first or second wafers being intended to be aligned with at least some of the microcomponents of the other of the first or second wafers and with the imposing of the predefined bonding curvature conducted to reduce or minimize overlay microcomponent misalignment between the bonded wafers.

10. The method according to claim 1, wherein the imposing of the predefined bonding curvature is achieved by applying a force on a central area of the first wafer comprising the at least one series of microcomponents thereon to obtain a desired radius of curvature.

11. The method according to claim 10, which further comprises releasing the second wafer after it conforms to the predefined bonding curvature and after the wafers are bonded together.

12. The method according to claim 1, wherein the imposing of the predefined bonding curvature is achieved by applying a membrane adjacent to the first wafer comprising the at least one series of microcomponents thereon, with the membrane having a curvature corresponding to the predefined bonding curvature.

13. The method according to claim 12, which further comprises releasing the second wafer after it conforms to the predefined bonding curvature and after the wafers are bonded together.

14. The method according to claim 1, wherein the wafers are bonded together in an apparatus that includes first and second holders for holding the first wafer and the second wafer respectively, wherein the first holder comprises means for imposing on the first wafer the predefined bonding curvature, and wherein the apparatus controls the second holder in order to release the second wafer from the second holder before or during the contacting with the first wafer so that the second wafer conforms to the predefined bonding curvature in the form of a paraboloid of revolution imposed on the first wafer during the propagating of a bonding wave.

15. The method according to claim 14, wherein the apparatus further comprises processing means for calculating the predefined bonding curvature in the form of a paraboloid of revolution depending on the intrinsic curvature before bonding of each of the wafers or a radius of curvature corresponding to the predefined bonding curvature in the form of a paraboloid of revolution.

16. The method according to claim 14, wherein the first holder further comprises a cylinder capable of imposing the predefined bonding curvature in the form of a paraboloid of revolution on the first wafer, with the cylinder being controlled according to a radius of curvature corresponding to the predefined bonding curvature in the form of a paraboloid of revolution, and the apparatus controls the second holder in order to release the second wafer from the second holder after contact with the first wafer so that the second wafer conforms to the predefined bonding curvature in the form of a paraboloid of revolution imposed on the first wafer during the propagation of a bonding wave.

17. The method according to claim 14, wherein the first holder has a curvature corresponding to the predefined bonding curvature in the form of a paraboloid of revolution or in that the apparatus further includes a membrane interposed between the first wafer and the first holder, with the membrane having a curvature corresponding to the predefined bonding curvature in the form of a paraboloid of revolution.

18. A method for reducing overlay misalignment during the direct bonding of a first wafer having a first intrinsic curvature to a second wafer having a second intrinsic curvature, with at least the first wafer comprising at least one series of microcomponents thereon, which method comprises:
   contacting the wafers with each other so as to initiate the propagation of a bonding wave between the wafers, and
   imposing a predefined bonding curvature in the form of a paraboloid of revolution on one of the first or second wafers during the contacting, with the predefined bonding curvature depending at least upon the first intrinsic curvature of the first wafer comprising the at least one series of microcomponents thereon, with the other of the first or second wafers being free to conform to the predefined bonding curvature, and before the wafers are bonded together:
   measuring the curvature of each wafer; and
   calculating the predefined bonding curvature from the measured curvature of each wafer.

* * * * *